(12) United States Patent
Sung et al.

(10) Patent No.: US 11,081,595 B1
(45) Date of Patent: Aug. 3, 2021

(54) MULTI-GATE TRANSISTOR AND MEMORY DEVICE USING THE SAME

(71) Applicant: MACRONIX INTERNATIONAL CO., LTD., Hsinchu (TW)

(72) Inventors: Cheng-Lin Sung, Taichung (TW); Pei-Ying Du, Hsinchu County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/877,518

(22) Filed: May 19, 2020

Related U.S. Application Data

(60) Provisional application No. 62/967,604, filed on Jan. 30, 2020.

(51) Int. Cl.
| | | |
|---|---|---|
| *G11C 16/04* | (2006.01) | |
| *H01L 29/788* | (2006.01) | |
| *G11C 11/56* | (2006.01) | |
| *H01L 29/792* | (2006.01) | |

(52) U.S. Cl.
CPC ...... *H01L 29/7887* (2013.01); *G11C 11/5621* (2013.01); *G11C 11/5671* (2013.01); *H01L 29/7923* (2013.01)

(58) Field of Classification Search
CPC ............ G11C 11/5621; G11C 11/5671; H01L 29/7887; H01L 29/7923
See application file for complete search history.

(56) References Cited

U.S. PATENT DOCUMENTS

| | | | |
|---|---|---|---|
| 6,747,895 B2* | 6/2004 | Umemoto | G11C 8/12 365/185.18 |
| 7,715,241 B2* | 5/2010 | Chen | G11C 16/0466 365/185.29 |
| 10,741,699 B2* | 8/2020 | Ema | G11C 16/10 |
| 2007/0272974 A1* | 11/2007 | King | H01L 27/115 257/324 |

* cited by examiner

*Primary Examiner* — Pho M Luu
(74) *Attorney, Agent, or Firm* — McClure, Qualey & Rodack, LLP

(57) ABSTRACT

A multi-gate transistor includes: a doped drain region; a doped source region; a gate group including a first gate and a second gate; a channel, the doped drain region and the doped source region being on respective two sides of the channel; and an interlayer, formed between the channel and the gate group, wherein a first gate voltage and a second gate voltage are applied to the first gate and the second gate of the gate group, respectively, the channel is induced as at least a P sub-channel and at least an N sub-channel and the multi-gate transistor equivalently behaves as a PNPN structure.

9 Claims, 4 Drawing Sheets

MULTI-GATE TRANSISTOR AND MEMORY DEVICE USING THE SAME

This application claims the benefit of U.S. provisional application Ser. No. 62/967,604, filed Jan. 30, 2020, the subject matter of which is incorporated herein by reference.

TECHNICAL FIELD

The disclosure relates in general to a multi-gate transistor and a memory device using the same.

BACKGROUND

With the rapid progress in artificial intelligent (AI) and big data analysis and so on, hardware accelerators have attracted lots of interest recently. As for the hardware accelerators, neuromorphic computing becomes a promising architecture for high throughput and low power consumption.

Integrate-and-fire (IF) circuits play one of important roles in neuromorphic computing. The main function of the IF circuit is to generate precise spiking pulses to represent data in terms of spike counts. Typical IF circuits need huge capacitors and differential amplifiers, and further the IF circuits need extra circuits to improve the fault-tolerance and to adjust the spiking frequency, which causes that the IF circuits have large circuit area.

SUMMARY

According to one embodiment, provided is a multi-gate transistor including: a doped drain region; a doped source region; a gate group including a first gate and a second gate; a channel, the doped drain region and the doped source region being on respective two sides of the channel; and an interlayer, formed between the channel and the gate group; wherein a first gate voltage and a second gate voltage are applied to the first gate and the second gate of the gate group, respectively; the channel is induced as at least a P sub-channel and at least an N sub-channel and the multi-gate transistor equivalently behaves as a PNPN structure.

According to another embodiment; provided is a memory device including: a memory array including a plurality of memory cells, a plurality of word lines and a plurality of bit lines; a data transporting circuit coupled to the memory array; an integrate-and-fire circuit coupled to the data transporting circuit, the data transporting circuit transporting a plurality of operations results of the memory cells of the memory array to the integrate-and-fire circuit, the integrate-and-fire circuit outputting a plurality of pluses according to the operations results of the memory cells of the memory array, wherein a count of the pulses represents the operations results of the memory cells; and a control circuit coupled to the integrate-and-fire circuit and the memory array, the control circuit outputting a control signal to the integrate-and-fire circuit and the memory array based on the pulses from the integrate-and-fire circuit, wherein the integrate-and-fire circuit includes a multi-gate transistor.

According to yet another embodiment, provided is a multi-gate transistor including: a doped drain region; a doped source region; a gate group including a first gate and a second gate; a doped channel, the doped drain region and the doped source region being on respective two sides of the doped channel; and an interlayer, formed between the doped channel and the gate group; wherein a first gate voltage and a second gate voltage are applied to the first gate and the second gate of the gate group to enhance channel sensing of the doped channel and the multi-gate transistor equivalently behaves as a PNPN structure.

Figure 1:
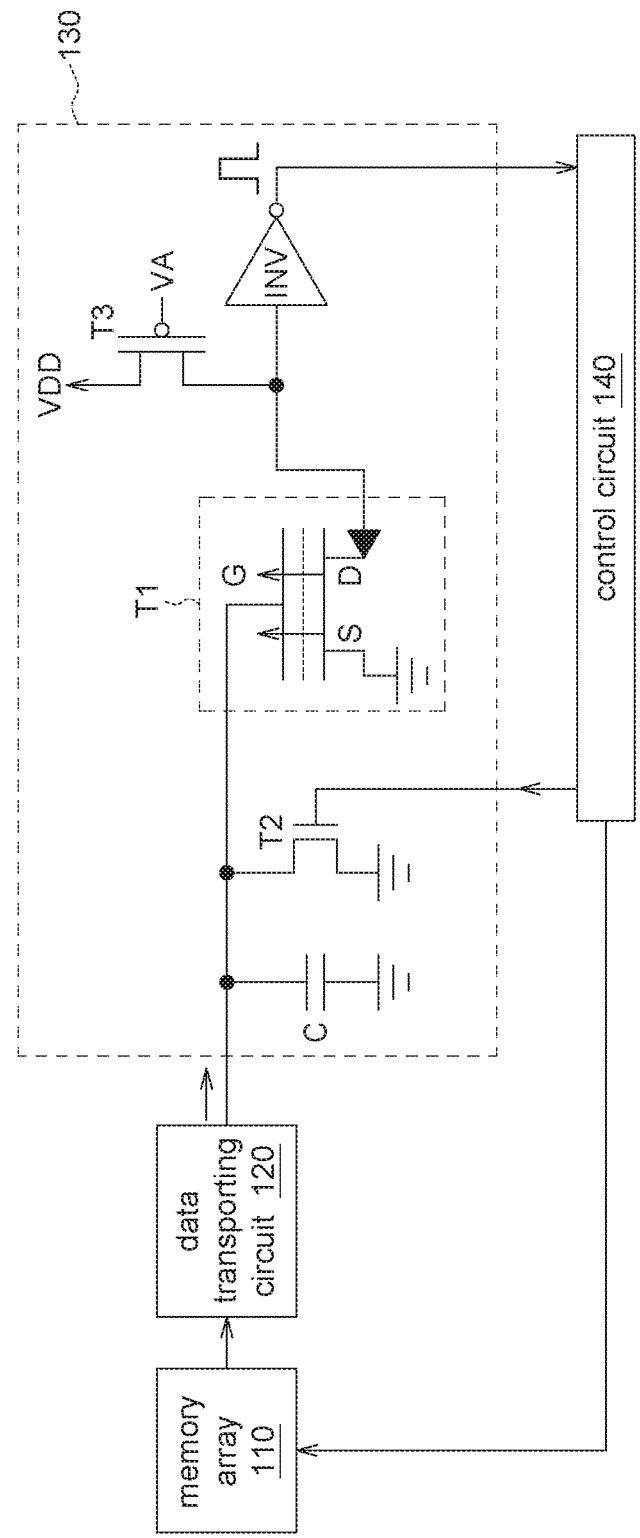
FIG. 1 shows a functional block diagram of a memory device according to one embodiment of the application.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

FIG. 1 shows a functional block diagram of a memory device according to one embodiment of the application. The memory device 100 in FIG. 1 may function as a neuromorphic hardware accelerator, but the application is not limited by this. The memory device 100 includes: a memory array 110, a data transporting circuit 120, an integrate-and-fire (IF) circuit 130 and a control circuit 140.

The memory array 110 includes a plurality of memory cells, a plurality of word lines and a plurality of bit lines. Structure of the memory array 110 is not specified here. The memory cells of the memory array 110 may be used to execute operations, for example but not limited by, multiplication and accumulation (MAC) operations.

The data transporting circuit 120 is coupled to the memory array 110, for transporting operations results of the memory cells of the memory array 110 to the IF circuit 130.

The IF circuit 130 is coupled to the data transporting circuit 120, for generating spiking pulses based on the operations results of the memory cells of the memory array 110. Counts of the spiking pulses represent the operations results of the memory cells of the memory array 110.

The control circuit 140 is coupled to the IF circuit 130 and the memory array 110. The control circuit 140 generates control signals to the IF circuit 130 and the memory array 110 based on the spiking pulses from the IF circuit 130, to adjust the pulse frequency and to improve fault-tolerance.

The IF circuit 130 includes: a capacitor C, a multi-gate transistor T1, an inhibitory transistor T2, an inverter INV and a bias transistor T3.

The capacitor C is coupled to the data transporting circuit 120, for storing data from the data transporting circuit 120.

The multi-gate transistor T1 has two gates or more gates. Details of the multi-gate transistor T1 are as follows. The multi-gate transistor T1 is coupled to the data transporting circuit 120, the inverter INV and the bias transistor T3, Further, the multi-gate transistor T1 has one gate coupled to the capacitor C, a source coupled to ground and a drain coupled to the inverter INV.

The inhibitory transistor T2 is coupled to the control circuit 140 and controlled by the control signal from the control circuit 140, When the control signal controls the inhibitory transistor T2 as being conducted, the inhibitory transistor T2 forms a discharge path to discharge the capacitor C.

The inverter INV has: input terminals coupled to the multi-gate transistor T1 and the bias transistor T3, and output terminal coupled to the control circuit 140. The inverter INV outputs pulses to the control circuit 140.

The bias transistor T3 includes: a gate receiving the bias voltage VA, a source coupled to the operation voltage VDD and a drain coupled to the inverter INV.

FIG. 2A to FIG. 2F show the multi-gate transistor T1 according to one embodiment of the application. As shown in FIG. 2A to FIG. 2F, the multi-gate transistor T1 includes: gates G1, G2, G3, a drain region (D), a source region (S), an interlayer 210 and an undoped channel 220. The drain region (D) is doped as a P+ junction while the source region (S) is doped as an N+ junction. The drain voltage VD and the source voltage applied to the drain region (0) and the source region (S) are for example but not limited by, +3V and 0V. In FIG. 2A to FIG. 2F, the gate G1 of the multi-gate transistor T1 is coupled to the capacitor C. The gates G1, G2 and G3 may also be referred as a gate group. The drain region (D) and the source region (S) are at two respective sides of the undoped channel 220. In the following, the channel is exemplified by the undoped channel 220. The application is not limited by this. In other possible embodiment of the application, the channel may be implemented as a doped channel, which is still within the spirit and scope of the application.

The interlayer 210 is for example but not limited by, a gate oxide layer or a charge storage layer. The charge storage layer is for example but not limited by, a floating gate or a charge trapping structure. The charge trapping structure is for example but not limited by, a SONOS (Silicon-Oxide-Nitride-Oxide-Silicon) layer or a BESONOS (Band-gap Engineered Silicon Oxide Nitride Oxide Silicon) layer.

According to the gate voltages VG1, VG2 and VG3 applied to the gates G1, G2 and G3, the undoped channel 220 is induced into three sub-channels 220_1, 220_2 and 220_3. In details; the gate voltage VG1 applied to the gate G1 induces the sub-channel 220_1 under the gate G1; the gate voltage VG2 applied to the gate G2 induces the sub-channel 220_2 under the gate G2; and the gate voltage VG3 applied to the gate G3 induces the sub-channel 220_3 under the gate G3.

Specifically, if the gate voltage is lower than the threshold voltage (Vth), then the P sub-channel is induced under the gate; and if the gate voltage is higher than the threshold voltage (Vth), then the N sub-channel is induced under the gate.

Figure 2A:
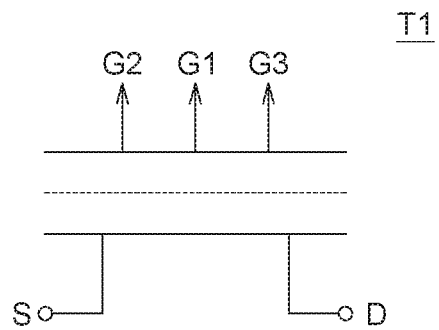
FIG. 2A to FIG. 2F show a multi-gate transistor according to one embodiment of the application.
Figure 2B:
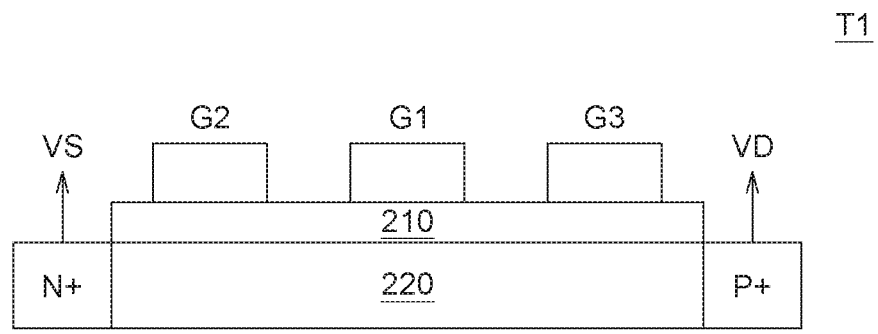
Figure 2C:
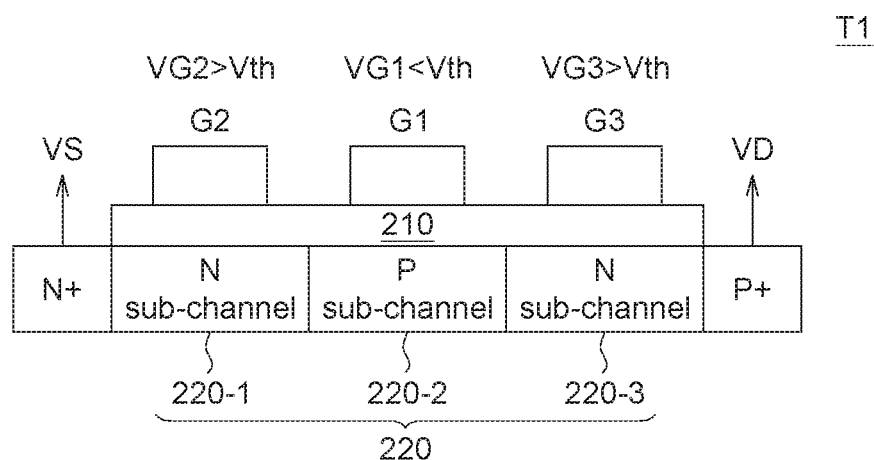

As shown in FIG. 2C, the gates VG1, VG2 and VG3 are VG1<Vth, VG2>Vth and VG3>Vth; and the induced three sub-channels 220_1, 220_2 and 220_3 are P sub-channel, N sub-channel and N sub-channel, respectively. Thus, as shown in FIG. 2C, the multi-gate transistor T1 is behaved as a PNPN structure. That is, from the right to the left of FIG. 2O, the drain region, the three sub-channels and the source regions are the P+ region (the P+ junction), the N sub-channel, the P sub-channel, the N sub-channel and the N+ region (the N+ junction). Thus, the multi-gate transistor T1 is equivalently behaved as a PNPN structure.

Further, in the embodiment of the application, in FIG. 2O, the three gate voltages VG1, VG2 and VG3 (VG1<Vth, VG2>Vth, VG3>Vth) are applied to induce the three sub-channels 220_1, 220_2 and 220_3 (as being the P sub-channel, the N sub-channel and the N sub-channel; respectively). After the three sub-channels are induced, the gate voltage VG1 is removed but the gate voltages VG2 and VG3 are still maintained for keeping the induced sub-channels. When the memory device 100 is applied in AI operations, the gate voltage VG1 of the gate G1 of the multi-gate transistor T1 is determined by the capacitor C and the inhibitory transistor T2. When the inhibitory transistor T2 is disconnected, the cross voltage of the capacitor C is the gate voltage of the gate G1 of the multi-gate transistor T1; and when the inhibitory transistor T2 is conducted, the capacitor C is discharged and thus the gate voltage of the gate G1 of the of the multi-gate transistor T1 is 0V. When the gate voltage of the gate G1 of the multi-gate transistor T1 (i.e. the cross voltage of the capacitor C) is higher than the threshold voltage, the multi-gate transistor T1 is conducted to output the spiking pulses to the inverter INV; and when the gate voltage of the gate G1 of the multi-gate transistor T1 (i.e. the cross voltage of the capacitor C) is lower than the threshold voltage, the multi-gate transistor T1 is disconnected and thus no spiking pulse is output to the inverter INV.

Figure 2D:
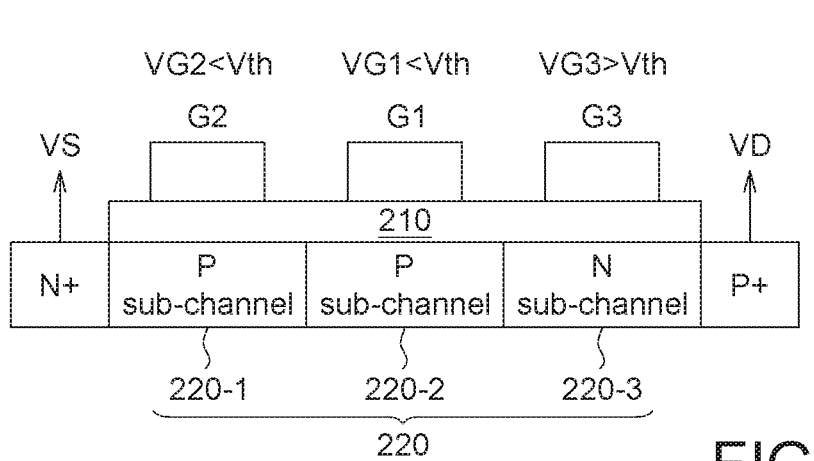

As shown in FIG. 2D, the gate voltages VG1-VG3 are applied as VG1<Vth, VG2<Vth and VG3>Vth, and thus the inducted three sub-channels 220_1, 220_2 and 220_3 are the P sub-channel, the P sub-channel and the N sub-channel, respectively. In FIG. 2D, the multi-gate transistor T1 is behaved as a PNPN structure. That is, from the right to the left of FIG. 2D the drain region, the three sub-channels and the source regions are the P+ region (the P+ junction), the N sub-channel, the P sub-channel, the P sub-channel and the N+ region (the N+ junction). Thus, the multi-gate transistor T1 is equivalently behaved as a PNPN structure.

Figure 2E:
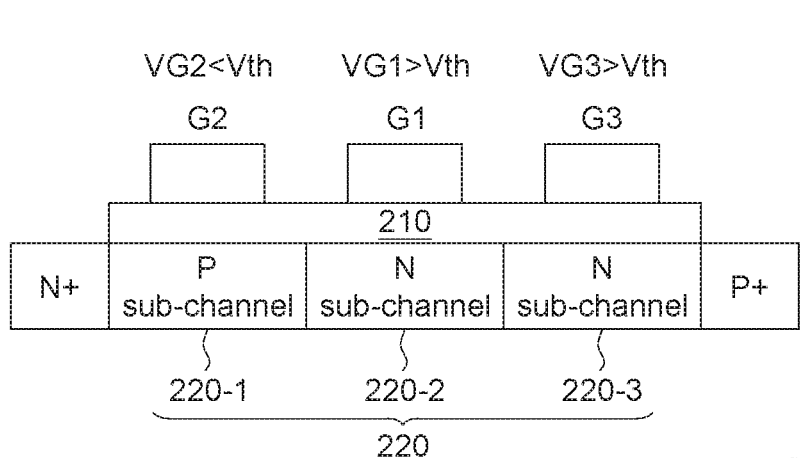

As shown in FIG. 2E, the gate voltages VG1-VG3 are applied as VG1>Vth, VG2<Vth and VG3>Vth, and thus the inducted three sub-channels 220_1, 220_2 and 220_3 are the N sub-channel, the P sub-channel and the N sub-channel, respectively. In FIG. 2E, the multi-gate transistor T1 is behaved as a PNPN structure. That is, from the right to the left of FIG. 2E, the drain region, the three sub-channels and the source regions are the P+ region (the P+ junction), the N sub-channel, the N sub-channel, the P sub-channel and the N+ region (the N+ junction). Thus, the multi-gate transistor T1 is equivalently behaved as a PNPN structure.

Figure 2F:
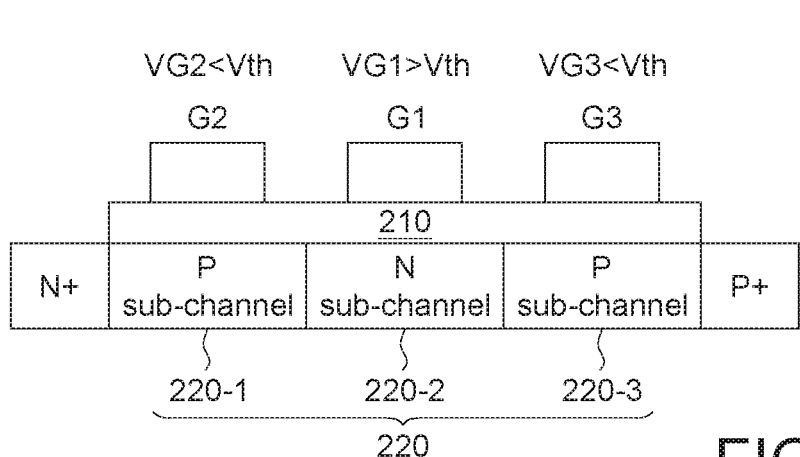

As shown in FIG. 2F, the gate voltages VG1-VG3 are applied as VG1>Vth, VG2<Vth and VG3<Vth, and thus the inducted three sub-channels 220_1, 220_2 and 220_3 are the N sub-channel, the P sub-channel and the P sub-channel, respectively. In FIG. 2F, the multi-gate transistor T1 is behaved as a PNPN structure. That is, from the right to the left of FIG. 2F, the drain region, the three sub-channels and the source regions are the P+ region (the P+ junction), the N sub-channel, the P sub-channel, the P sub-channel and the N+ region (the N+ junction). Thus, the multi-gate transistor T1 is equivalently behaved as a PNPN structure.

Figure 3A:
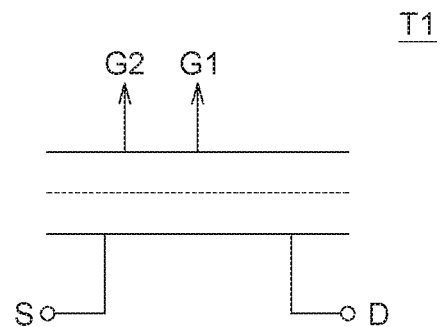
FIG. 3A to FIG. 3C show a multi-gate transistor according to another embodiment of the application.
Figure 3B:
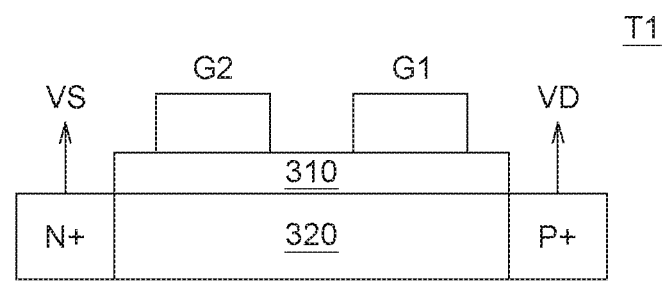
Figure 3C:
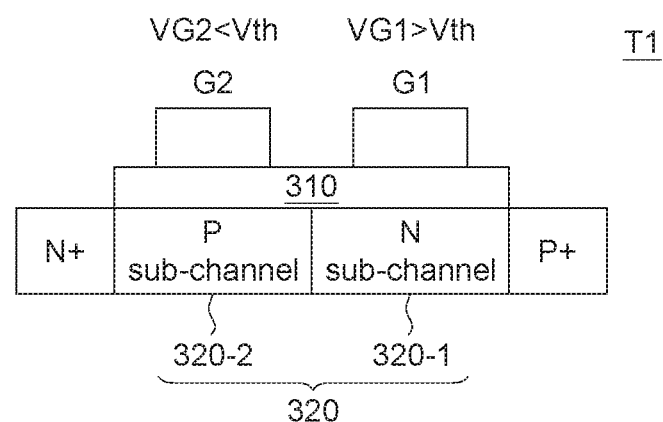

FIG. 3A to FIG. 3O show the multi-gate transistor T1 according to another embodiment of the application. As shown in FIG. 3A to FIG. 3C the multi-gate transistor T1 includes: gates G1 G2, a drain region (D), a source region (5), an interlayer 310 and an undoped channel 320. The gate G1 of the multi-gate transistor T1 is coupled to the capacitor C.

According to the gate voltages VG1 and VG2 applied to the gates G1 and G2, the undoped channel 320 is induced into two sub-channels 320_1 and 320_2. In details, the gate voltage VG1 applied to the gate G1 induces the sub-channel 320_1 under the gate G1; and the gate voltage VG2 applied to the gate G2 induces the sub-channel 320_2 under the gate G2.

Specifically; if the gate voltage is lower than the threshold voltage (Vth), then the P sub-channel is induced under the gate; and if the gate voltage is higher than the threshold voltage (Vth), then the N sub-channel is induced under the gate.

As shown in FIG. 3C, the gates VG1 and VG2 are VG1>Vth and VG2<Vth; and the induced two sub-channels 320_1 and 320_2 are N sub-channel and P sub-channel, respectively. Thus, as shown in FIG. 3C, the multi-gate transistor T1 is behaved as a PNPN structure. That is, from the right to the left of FIG. 3C, the drain region, the two sub-channels and the source regions are the P+ region (the P+ junction), the N sub-channel, the P sub-channel and the N+ region (the N+ junction). Thus, the multi-gate transistor T1 is equivalently behaved as a PNPN structure.

Of course, the application is not limited by the above cases. One skilled in the art would acknowledge how to control the gate voltage and to equivalently behave the multi-gate transistor T1 as a PNPN structure.

In other possible embodiments of the application, the channel is also a doped channel, which is still within the spirit and the scope of the application. When the channel is a doped channel, by controlling the gate voltages applied to the multi-gate transistor, the channel sensing is enhanced and also the multi-gate transistor T1 equivalently behaves as a PNPN structure. Further, in other possible embodiments of the application, no matter how the doped channel of the multi-gate transistor is doped, by controlling the gate voltages applied to the multi-gate transistor, the multi-gate transistor T1 equivalently behaves as a PNPN structure.

Further, in other possible embodiments of the application, the multi-gate transistor T1 may include four gates or more gates. The principles are as above and are omitted here.

In the above embodiments of the application, the multi-gate transistor T1 includes at least two gates and the channel is undoped; and the voltage applied to the gate may induce the sub-channels into P sub-channel and N sub-channel in the undoped channel.

In the embodiments of the application, the multi-gate transistor T1 has a super-steep slope V-I (voltage-current) relationship diagram. When the multi-gate transistor T1 is conducted, the multi-gate transistor T1 outputs a spiking pulse (the voltage of the pulse is the cross-voltage of the capacitor C) to the inverter INV. The control circuit 140 may output the control signals to the next stage or fed back to the current stage for further processing.

In the embodiments of the application, the multi-gate transistor T1 has very small sub-threshold swing (SS) and thus the energy consumption is also small.

The memory device of the embodiments of the application may be applied in AI pattern identification and homeostasis operations, having high identification rate and low power consumption.

In the embodiments of the application; the integrate-and-fire circuit includes the super-steep slope sub-threshold swing multi-gate transistor which replaces the large-sized differential amplifier and also generates precise timing pulses. Further, by adjusting the threshold voltage of the multi-gate transistor, the multi-gate transistor itself may perform frequency normalization without extra circuit.

Thus, the memory device (which is used in hardware accelerator) of the embodiments of the application has small circuit area.

Still, the super-steep slope sub-threshold swing multi-gate transistor has high tolerance to process variations and circuit noises.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A multi-gate transistor including:
   a doped drain region;
   a doped source region;
   a gate group including a first gate and a second gate;
   a channel, the doped drain region and the doped source region being on respective two sides of the channel; and
   an interlayer, formed between the channel and the gate group,
   wherein a first gate voltage and a second gate voltage are applied to the first gate and the second gate of the gate group, respectively, the channel is induced as at least a P sub-channel and at least an N sub-channel and the multi-gate transistor equivalently behaves as a PNPN structure.

2. The multi-gate transistor according to claim 1, wherein when the first gate voltage is higher than a threshold voltage, a first sub-channel corresponding to the first gate is induced as an N sub-channel in the channel; and
   when the second gate voltage is lower than the threshold voltage, a second sub-channel corresponding to the second gate is induced as a P sub-channel in the channel.

3. The multi-gate transistor according to claim 1, wherein the gate group further includes a third gate,
   when the first gate voltage is lower than a threshold voltage, a first sub-channel corresponding to the first gate is induced as a P sub-channel in the channel;
   when the second gate voltage is higher than the threshold voltage, a second sub-channel corresponding to the second gate is induced as an N sub-channel in the channel; and
   when a third gate voltage applied to the third gate is higher than the threshold voltage, a third sub-channel corresponding to the third gate is induced as an N sub-channel in the channel.

4. The multi-gate transistor according to claim 1, wherein the gate group further includes a third gate,
   when the first gate voltage is lower than a threshold voltage, a first sub-channel corresponding to the first gate is induced as a P sub-channel in the channel;
   when the second gate voltage is lower than the threshold voltage, a second sub-channel corresponding to the second gate is induced as a P sub-channel in the channel; and
   when a third gate voltage applied to the third gate is higher than the threshold voltage, a third sub-channel corresponding to the third gate is induced as an N sub-channel in the channel.

5. The multi-gate transistor according to claim 1, wherein the gate group further includes a third gate,
   when the first gate voltage is higher than a threshold voltage, a first sub-channel corresponding to the first gate is induced as an N sub-channel in the channel;

when the second gate voltage is lower than the threshold voltage, a second sub-channel corresponding to the second gate is induced as a P sub-channel in the channel; and when a third gate voltage applied to the third gate is higher than the threshold voltage, a third sub-channel corresponding to the third gate is induced as an N sub-channel in the channel.

6. The multi-gate transistor according to claim 1, wherein the gate group further includes a third gate, when the first gate voltage is higher than a threshold voltage, a first sub-channel corresponding to the first gate is induced as an N sub-channel in the channel;

when the second gate voltage is lower than the threshold voltage, a second sub-channel corresponding to the second gate is induced as a P sub-channel in the channel; and when a third gate voltage applied to the third gate is lower than the threshold voltage, a third sub-channel corresponding to the third gate is induced as a P sub-channel in the channel.

7. The multi-gate transistor according to claim 1, wherein the interlayer is a gate oxide layer or a charge storage layer, and the charge storage layer is a floating gate or a charge trapping structure.

8. A memory device including:
a memory array including a plurality of memory cells, a plurality of word lines and a plurality of bit lines;
a data transporting circuit coupled to the memory array;
an integrate-and-fire circuit coupled to the data transporting circuit, the data transporting circuit transporting a plurality of operations results of the memory cells of the memory array to the integrate-and-fire circuit, the integrate-and-fire circuit outputting a plurality of pluses according to the operations results of the memory cells of the memory array, wherein a count of the pulses represents the operations results of the memory cells; and a control circuit coupled to the integrate-and-fire circuit and the memory array, the control circuit outputting a control signal to the integrate-and-fire circuit and the memory array based on the pulses from the integrate-and-fire circuit, wherein the integrate-and-fire circuit includes a multi-gate transistor as claimed in claim 1.

9. A multi-gate transistor including:
a doped drain region;
a doped source region;
a gate group including a first gate and a second gate;
a doped channel, the doped drain region and the doped source region being on respective two sides of the doped channel; and
an interlayer, formed between the doped channel and the gate group,
wherein a first gate voltage and a second gate voltage are applied to the first gate and the second gate of the gate group to enhance channel sensing of the doped channel and the multi-gate transistor equivalently behaves as a PNPN structure.

* * * * *